United States Patent
Patti

(10) Patent No.: US 11,610,880 B2
(45) Date of Patent: Mar. 21, 2023

(54) POWER MOS DEVICE HAVING AN INTEGRATED CURRENT SENSOR AND MANUFACTURING PROCESS THEREOF

(71) Applicant: STMicroelectronics S.r.l., Agrate Brianza (IT)

(72) Inventor: Davide Giuseppe Patti, Mascalucia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 138 days.

(21) Appl. No.: 17/182,773

(22) Filed: Feb. 23, 2021

(65) Prior Publication Data

US 2021/0183849 A1    Jun. 17, 2021

Related U.S. Application Data

(62) Division of application No. 15/965,759, filed on Apr. 27, 2018, now Pat. No. 10,943,896.

(30) Foreign Application Priority Data

Apr. 28, 2017   (IT) .......... 102017000046614

(51) Int. Cl.
```
H01L 27/02      (2006.01)
H01L 29/10      (2006.01)
H01L 29/78      (2006.01)
H01L 29/417     (2006.01)
H01L 29/66      (2006.01)
```
(52) U.S. Cl.
CPC ...... *H01L 27/0251* (2013.01); *H01L 29/1095* (2013.01); *H01L 29/41766* (2013.01); *H01L 29/66734* (2013.01); *H01L 29/7803* (2013.01); *H01L 29/7813* (2013.01); *H01L 29/7815* (2013.01); *H01L 29/66696* (2013.01); *H01L 29/7809* (2013.01)

(58) Field of Classification Search
CPC ............. H01L 27/0251; H01L 29/1095; H01L 29/41766; H01L 29/66734; H01L 29/7803; H01L 29/7813; H01L 29/7815; H01L 29/66696; H01L 29/7809
USPC ................. 257/329; 438/138, 208, 212, 259, 438/268–274, 280, 424, 587–589
See application file for complete search history.

(56) References Cited

U.S. PATENT DOCUMENTS

| | | |
|---|---|---|
| 4,931,844 A | 6/1990 | Zommer |
| 5,408,141 A | 4/1995 | Devore et al. |

(Continued)

FOREIGN PATENT DOCUMENTS

| | | |
|---|---|---|
| JP | 5167077 A | 7/1993 |
| JP | 10326897 A | 12/1998 |

(Continued)

*Primary Examiner* — Thao X Le
*Assistant Examiner* — Eric W Jones
(74) *Attorney, Agent, or Firm* — Seed Intellectual Property Law Group LLP

(57) ABSTRACT

Power MOS device, in which a power MOS transistor has a drain terminal that is coupled to a power supply node, a gate terminal that is coupled to a drive node and a source terminal that is coupled to a load node. A detection MOS transistor has a drain terminal that is coupled to a detection node, a gate terminal that is coupled to the drive node and a source terminal that is coupled to the load node. A detection resistor has a first terminal coupled to the power supply node and a second terminal coupled to the detection node.

20 Claims, 10 Drawing Sheets

(56) References Cited

U.S. PATENT DOCUMENTS

| | | |
|---|---|---|
| 7,932,553 B2 | 4/2011 | Yamaguchi et al. |
| 10,651,165 B2 | 5/2020 | Laven et al. |
| 2004/0222483 A1 | 11/2004 | Frisina et al. |
| 2011/0012195 A1 | 1/2011 | Momota et al. |
| 2011/0227069 A1 | 9/2011 | Hahimoto |
| 2012/0068296 A1 | 3/2012 | Takaya et al. |
| 2013/0001792 A1 | 1/2013 | Uno et al. |
| 2015/0097233 A1 | 4/2015 | Zundel et al. |
| 2015/0333060 A1 | 11/2015 | Decker et al. |
| 2016/0079377 A1 | 3/2016 | Hutzler et al. |
| 2016/0093728 A1 | 3/2016 | Decker et al. |
| 2017/0111037 A1 | 4/2017 | Shiigi et al. |

FOREIGN PATENT DOCUMENTS

| | | |
|---|---|---|
| JP | 2012060069 A | 3/2012 |
| WO | WO 8908928 A1 | 9/1989 |

POWER MOS DEVICE HAVING AN INTEGRATED CURRENT SENSOR AND MANUFACTURING PROCESS THEREOF

BACKGROUND

Technical Field

The present disclosure relates to a power MOS device having an integrated current sensor and to the manufacturing process thereof.

Description of the Related Art

As is known, in power electronic applications, a power MOS device is used to supply current to a load, and it is usually desirable to know the current being supplied. Existing power devices therefore often have current detection structures integrated in the power device.

Many such devices are based on the same MOS technology used for the power device.

An example of an electric diagram of a known power device integrating a sensor for detecting current is shown in FIG. 1.

Here, a power MOS device 1 includes a power MOS transistor 2, the gate terminal of which is coupled to a drive node 6, the drain terminal is coupled to a power supply node 7 and the source terminal is coupled to a first terminal of a load element 5, having a second terminal coupled to a reference-potential line (ground) 9.

Furthermore, the power MOS device 1 also includes a detection MOS transistor 3, the gate terminal of which is coupled to the drive node 6, the drain terminal is coupled to the power supply node 7 and the source terminal is coupled to a detection node 8.

A detection resistor 4 is arranged between the detection node 8 and the reference-potential line 9. Alternatively, the detection resistor may be arranged between the source terminals of the MOS transistors 2, 3.

Here, in use, the power supply node 7 receives a power supply voltage Vs. The drive node 6 receives a drive signal Ds.

The drive signal Ds controls the power MOS transistor 2 and the detection MOS transistor 3, turning the transistors on via the respective gate terminals. The current flowing through the resistor 4 is monitored by measuring the voltage on the detection node 8.

Indeed, the current flowing through the detection resistor 4 and the current flowing through the load element 5 are proportional to one another according to the following equation:

$$I_r = \frac{P_2}{P_3} I_L \quad (1)$$

where $P_2$ is the perimeter of the channel of the power MOS transistor 2, $P_3$ is the perimeter of the channel of the detection MOS transistor 3, $I_r$ is the current flowing through the detection resistor 4 and IL is the current flowing through the load element 5 and supplied by the power MOS transistor 2.

With the solution of FIG. 1, by properly dimensioning the MOS transistors 2 and 3 it is possible to cause the current $I_r$ flowing through the detection resistor 4 to be significantly less than the current IL flowing through the load element 5 (for example, 1000 times less).

The structure shown in FIG. 1 is disadvantageous since there is an electrical misalignment between the power MOS transistor 2 and the detection MOS transistor 3 caused by the voltage drop on the detection resistor 4.

Indeed, the voltage drop on the detection resistor 4 reduces the gate-source voltage ($V_{GS}$) of the detection MOS transistor 3. Consequently, the detection MOS transistor 3 is not subject to the same operating conditions as the power MOS transistor 2.

This electrical misalignment introduces a systematic error in the measurement of the current supplied to the load element 5. Furthermore, the error varies as a function of the electrical operating region of the power MOS transistor 2.

In particular, the error is minimal in the saturation region. Conversely, the error is greatest in the linear region and for voltages $V_{GS}$ close to the threshold value. On the other hand, adjustments made to compensate for the error may have unwanted effects on the cost and/or size of the device.

BRIEF SUMMARY

The present disclosure is intended to provide a power MOS device having an integrated current sensor and a manufacturing process thereof that address the drawbacks in the prior art.

The present disclosure provides for a power MOS device and manufacturing process thereof.

BRIEF DESCRIPTION OF THE SEVERAL VIEWS OF THE DRAWINGS

For a better understanding of the present disclosure preferred embodiments thereof will be described, purely as non-limiting examples, with reference to the attached drawings, in which.

DETAILED DESCRIPTION

Figure 2:
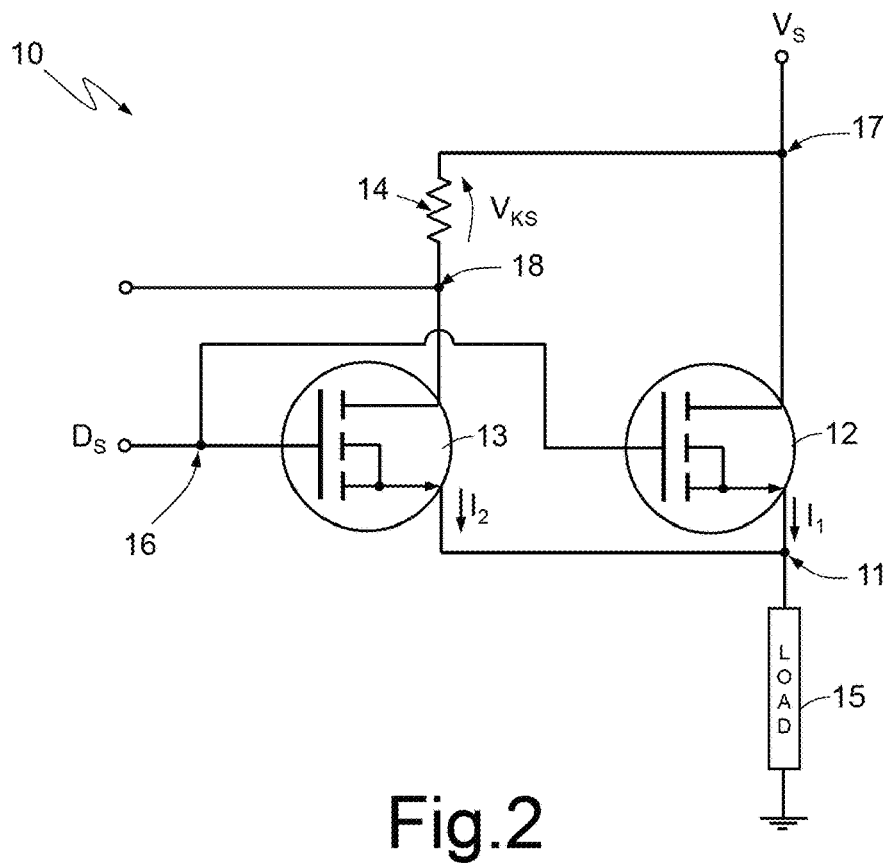
FIG. 2 shows the electric diagram of the present power MOS device.

FIG. 2 shows a power MOS device 10 including a power MOS transistor 12 and a detection MOS transistor 13.

The power MOS transistor 12 has a gate terminal that is coupled to a drive node 16, a drain terminal that is coupled to a power supply node 17 and a source terminal forming a load node 11. FIG. 2 also shows a load 15 (typically outside the power MOS device 10) that is designed to be coupled between the load node 11 and a reference-potential line (ground).

The detection MOS transistor 13 has a gate terminal that is coupled to the drive node 16, a drain terminal forming a detection node 18 and a source terminal coupled to the load node 11.

A detection resistor 14 has a first terminal coupled to the power supply node 17 and a second terminal coupled to the detection node 18.

In use, the power supply node 17 receives a power supply voltage Vs and the drive node 16 receives a drive signal Ds, in a known manner.

Furthermore, the detection MOS transistor 13 and the detection resistor 14 detect the current supplied by the power MOS transistor 12 to the load 15.

Indeed, the power MOS transistor 12 and the detection MOS transistor 13 have the same voltage drop $V_{GS}$ between the gate and source terminals, and are therefore under the same biasing conditions. The power MOS transistor 12 and the detection MOS transistor 13 therefore conduct respective currents $I_1$, $I_2$ that are proportional to one another according to the equation (1).

The current $I_2$ flowing through the detection MOS transistor 13 also flows through the detection resistor 14 and may be determined from the voltage drop on the detection resistor 14 itself, detecting the potential on the detection node 18.

The power MOS device 10 addresses the problem of electrical misalignment between the power MOS transistor 12 and the detection MOS transistor 13, since they are biased in exactly the same manner, as previously specified. The power MOS device 10 is therefore not affected by the electrical misalignment and systematic error of the known power device in FIG. 1.

In the power MOS device 10, both the current $I_1$ (flowing through the power MOS transistor 12) and the current $I_2$ (flowing through the detection MOS transistor 13) are supplied to the load 15. Consequently, the power MOS device 10 has a high efficiency and enables a very wide choice of the area ratio between the MOS transistors 12 and 13.

Figure 3:
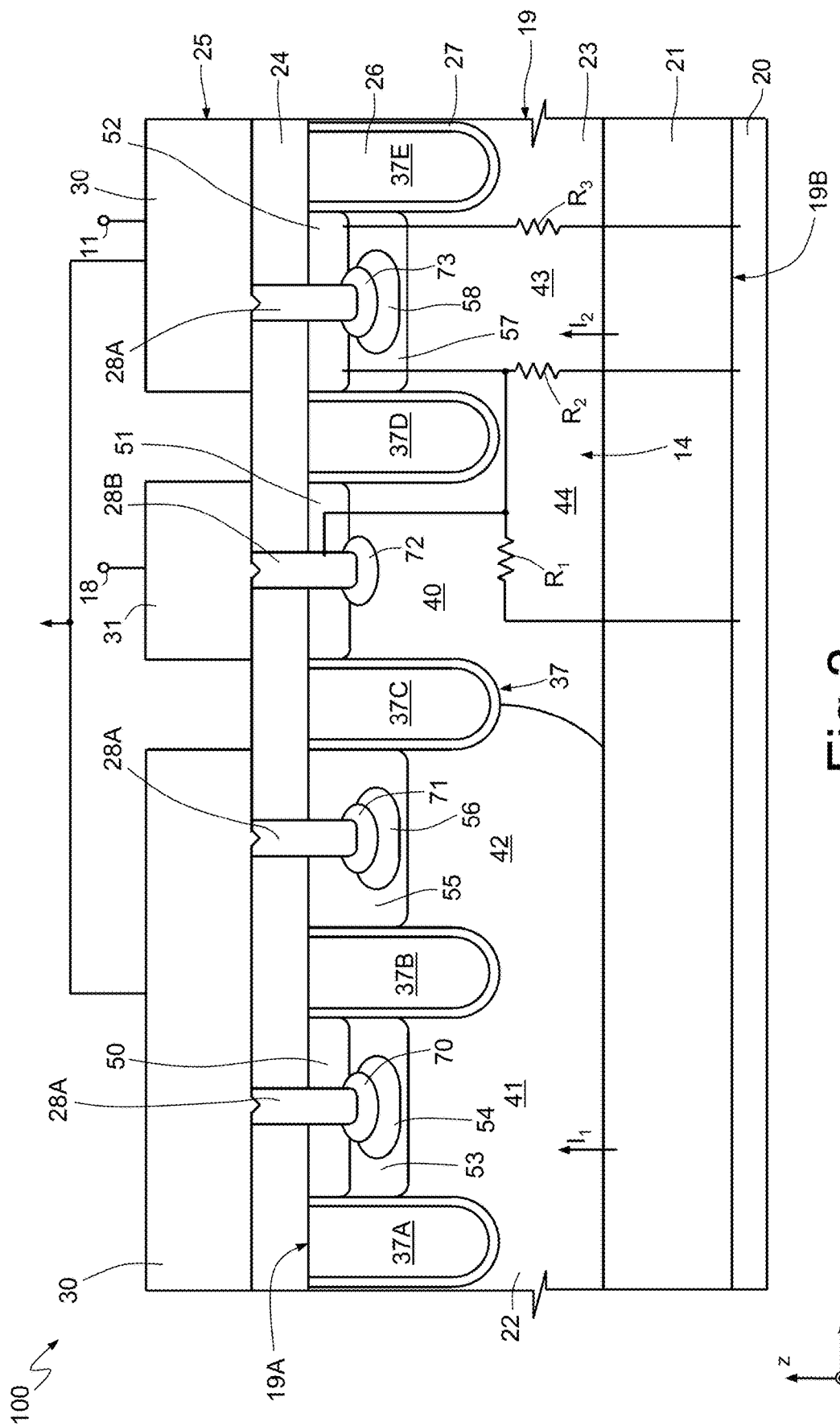
FIG. 3 shows a cross section of a portion of a possible implementation of the power MOS device of FIG. 2.
Figure 4:
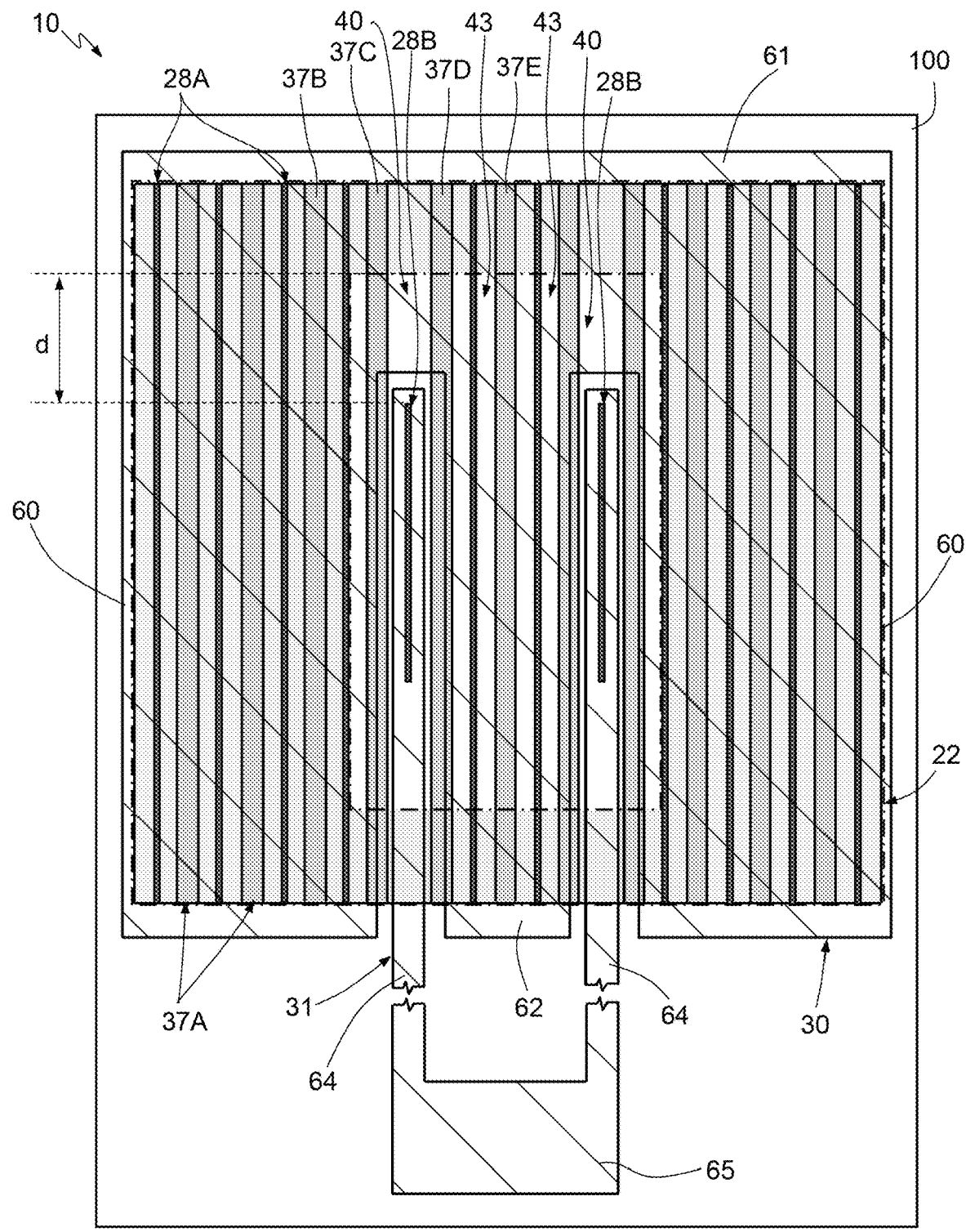
FIG. 4 is a top view of the power MOS device of FIG. 3.

FIGS. 3 and 4 show a possible implementation of the power MOS device 10 in FIG. 2. In particular, FIG. 3 is a cross section of just one portion of the structure in FIG. 4 and the entire structure is obtained by flipping FIG. 3 about the right-hand edge of same and continuing on both sides.

The power MOS device 10 is integrated in a die 100 made of semiconductor material including a semiconductor body 19 (made for example of silicon), having a first conductivity type (for example N) and first and second surfaces 19A, 19B.

The semiconductor body 19 includes a substrate 21 and an epitaxial layer 23 arranged on top of one another and respectively forming the second and first surfaces 19B, 19A. The substrate 21 has a doping level that is much greater than the doping level of the epitaxial layer 23 (for example, the substrate 21 has a doping level that is greater than $10^{19}$ atoms/cm$^3$ and the epitaxial layer 23 has a doping level of between $10^{14}$ and $10^{15}$ atoms/cm$^3$).

The epitaxial layer 23 includes a drift region 22 having the same conductivity type as the epitaxial layer, but a doping level that is higher and suited to the breakdown voltage to be sustained (for example greater than $10^{16}$ atoms/cm$^3$). The drift region 22 extends between the first surface 19A and the substrate 21 through the entire thickness of the epitaxial layer 23 and, in plan view (FIG. 4), is frame-shaped and is arranged close to the periphery of the die 100.

The epitaxial layer 23 also accommodates a plurality of insulated gate regions 37A-37E, hereinafter referred to as active, inactive and detection gate regions. As shown in FIG. 3, the insulated gate regions 37A-37E extend from the first surface 19A towards the substrate 21 and, in the top view of FIG. 4, parallel to one another and to an axis Y of a Cartesian coordinate system XYZ. Each of the insulated gate regions 37A-37E includes a conductive trench gate region 26, for example made of polysilicon, surrounded by an insulating gate layer 27, for example made of silicon oxide. The trench gate regions 26 are all coupled together electrically.

Pairs of adjacent insulated gate regions 37A-37E define respective portions of the epitaxial layer 23 extending parallel to the axis Y. In particular, in the present embodiment, the pairs of insulated gate regions 37A-37E delimit two coupling portions 40 (only one shown in FIG. 3), a plurality of active portions 41 (only one shown in FIG. 3), two inactive portions 42 (only one shown in FIG. 3), and two detection portions 43 (only one shown in FIG. 3).

The active portions 41 and the inactive portions 42 are within the drift region 22. In particular, FIG. 3 shows an active portion 41 arranged between a first and a second active gate regions 37A, 37B and an inactive portion 42 arranged between the second active gate region 37B and an inactive gate region 37C. As shown in FIG. 3, the inactive gate region 42 extends approximately along the longitudinal internal edge (parallel to the axis Y) of the drift region 22.

The coupling portions 40 and the detection portions 43 are arranged in the zone of the epitaxial layer 23 surrounded by the drift region 22. In particular, FIG. 3 shows a coupling portion 40 arranged between the inactive gate region 37C and a first detection gate region 37D, and a detection portion 43 arranged between the first detection gate region 37D and a second detection gate region 37E.

The active portion 41 contains an N-type active source region 50 (for example with a doping level greater than $10^{19}$ atoms/cm$^3$), a P-type active channel region 53, a first P-type active enriched region 54 with a doping level greater than the active channel region 53 (for example with a doping level greater than $5 \cdot 10^{17}$ atoms/cm$^3$), and a second P-type active enriched region 70 with a doping level greater than the first active enriched region 54. More specifically, the active source region 50 extends from the first surface 19A, the active channel region 53 extends beneath the active source region 50, the first active enriched region 54 lies inside the active channel region 53, and the second active enriched region 70 lies above the first active enriched region 54, straddling the interface between the active source region 50 and the active channel region 53.

Similarly, the detection portion 43 accommodates a P-type detection channel region 57, a first P-type enriched detection region 58 with a doping level greater than the detection channel region 57, a second P-type enriched detection region 73 with a doping level greater than the first enriched detection region 58, and an N-type detection source region 52. The detection source region 52 extends from the first surface 19A, the detection channel region 57 extends beneath the detection source region 52, the first enriched detection region 58 extends inside the detection channel region 57, and the second enriched detection region 73 extends above the first enriched detection region 58, at the interface between the detection source region 52 and the detection channel region 57.

The inactive portion 42 accommodates a P-type pseudo-channel region 55, a first P-type inactive enriched region 56 with a doping level greater than the pseudo-channel region 55, and a second P-type inactive enriched region 71 with a doping level greater than the first inactive enriched region 56. The pseudo-channel region 55 extends from the first surface 19A, the first inactive enriched region 56 extends inside the pseudo-channel region 55, and the second inactive enriched region 71 extends above the first inactive enriched region 56.

An upper portion of the coupling portion 40 accommodates an N-type enrichment region 51 with a high doping level (for example equal to the doping level of the active source and detection source regions 50, 52), extending from the first surface 19A. Furthermore, the coupling portion 40 accommodates an enriched coupling region 72 approximately beneath the enrichment region 51.

In practice, the drift region 22 and the regions contained therein form the power MOS transistor 12 of FIG. 2, and the detection portion 43 and the regions contained therein form the detection MOS transistor 13 in FIG. 2. As explained in greater detail below, the portion of the epitaxial layer beneath the coupling portion 40 and the detection portion 43 define a resistive detection portion 44. This forms the detection resistor 14 in FIG. 2, represented here by three resistive elements $R_1$, $R_2$ and $R_3$, in which $R_1$ is connected in series to the parallel circuit formed by $R_2$ and $R_3$.

Furthermore and as shown in the top view in FIG. 4, the area of the power MOS transistor 12 (which approximately matches the area of the drift region 22) is much greater than the area of the detection MOS transistor 13 (which approximately matches the area of the detection portions 43, only one of which is shown in FIG. 3).

A drain metallization layer 20 (for example comprising three superposed layers of titanium, nickel and gold) is arranged beneath the second surface 19B and form the drain terminal of the power MOS transistor 12 and of the detection MOS transistor 13, as well as the power supply node 17 in FIG. 2.

Furthermore, an insulating layer 24, for example of silicon oxide ($SiO_2$) extends above the first surface 19A. First and second contact regions 28A, 28B of conductive material (such as tungsten and/or titanium) extend through the insulating layer 24 as well as in the epitaxial layer 23. Each first contact region 28A extends vertically (in a direction Z of the Cartesian coordinate system XYZ) inside a respective portion 41-43 of the epitaxial layer 23, through the channel regions 53, 55, 57 into the second enriched regions 70, 71, 73. Each contact region 28B (only one of which is shown in FIG. 3) extends vertically (in direction Z) inside a respective portion 40 of the epitaxial layer 23, through the enrichment region 51 into the enriched region 72.

A source metallization layer 25 made of conductive material (such as aluminum) is arranged above the insulating layer 24 and forms (see in particular FIG. 4) a source metallization region 30 and a detection metallization region 31. As shown in particular in FIG. 4, the source metallization region 30 is trident-shaped, having two outer arms 60, an inner arm 62 and a base 61. The outer arms 60 extend parallel to the axis Y, substantially above the drift region 22; the base 61 extends parallel to the axis X above the drift region 22; and the inner arm 62 extends parallel to the axis Y, substantially above the detection portion 43. The detection metallization region 31 is U-shaped, substantially complementary to the shape of the source metallization region 30 and has two arms 64 extending above the coupling portions 40 and between the arms 61, 62 of the source metallization region 30. The arms 64 of the detection metallization region 31 are connected to a pad 65. The die 100 also accommodates bias and connection structures of the trench gate region 26 and a pad for the source metallization region 30, not shown.

The source metallization region 30 is in electrical contact with the contact regions 28A, so as to contact the source regions 53, 57 of the MOS transistors 12, 13. The detection metallization region 31 is in electrical contact with the contact regions 28B, so as to contact the coupling portions 40. In practice, the source metallization region 30 forms the load node 11 in FIG. 2 and the detection metallization region 31 forms the detection node 18.

As shown in FIG. 4, the first contact regions 28A extend along practically the entire length (in direction Y) of the metallization layer 25, while the second contact regions 28B extend along a length (in direction Y) that is less than the length of the coupling and detection portions 40, 43 such as to end at a distance d (for example 6-10 μm) from the transverse edge parallel to the axis X and close to the base 61 of the source metallization region 30 of the drift region 22.

In use, the power supply voltage Vs is supplied to the drain metallization layer 20 and the drive signal Ds is supplied to the gate regions 37A-37E. Furthermore, the pad 65 (corresponding to the node 18 in FIG. 2) is connected to the detection circuit (not shown) for detecting the potential of same node. The current $I_1$ supplied by the power MOS transistor 12 flows between the drain metallization layer 20 and the source regions 50, through the drift region 22 and the active channel regions 53.

The presence of the inactive portion 42 on the edge of the drift region 22 between the active portion 41 and the coupling portion 40, as well as the distance d between the transverse edge (parallel to the axis X in FIG. 4) of the drift region 22 and the end of the second contact regions 28B prevent the current $I_1$ from flowing towards the coupling region 40, causing a voltage drop on this latter and a detection error.

The current $I_2$ supplied by the detection transistor 13 flows between the drain metallization layer 20 and the source regions 52, passing through the resistive detection portion 44, the detection portions 43 and the detection channel regions 57.

The voltage drop across the resistive detection portion 44 is detected via the coupling portion 40, the second contact 28B and the detection metallization region 31, enabling detection of the drop on the detection resistor 14 and therefore the current $I_2$ as well as, using the known surface area ratio, the current $I_1+I_2$ supplied to the load. It can be seen that the coupling portion 40 does not contribute to the current $I_2$, since the detection node 18 is coupled to an input of the detection circuit (not shown) that is normally high-impedance. Consequently, no current flows through the coupling portion 40 and therefore the resistivity of said coupling portion 40 does not affect the current $I_2$.

Figure 1:
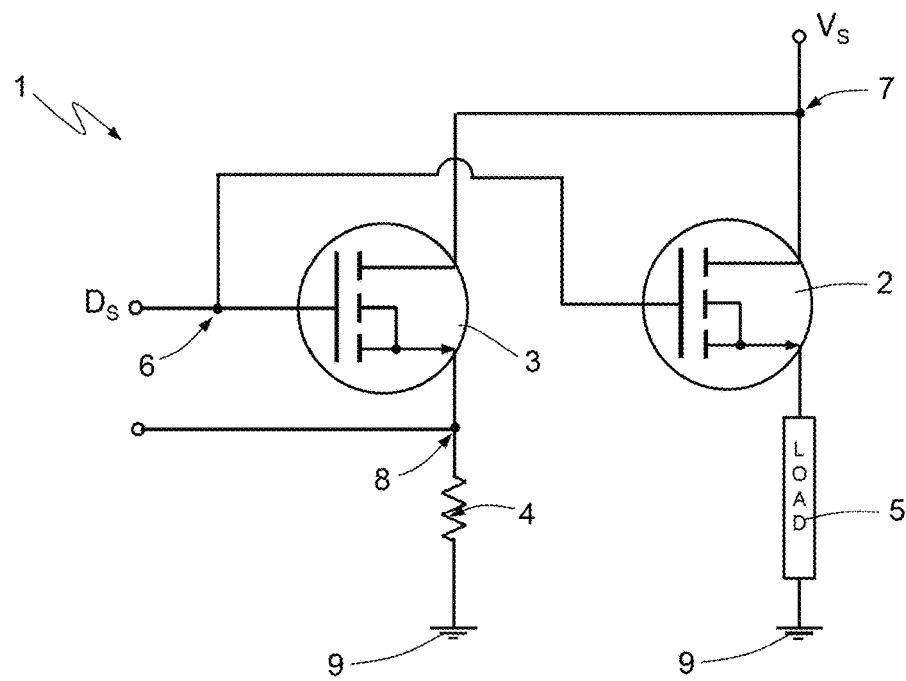
FIG. 1 shows the electric diagram of a known power MOS device with an integrated current sensor.
Figure 5:
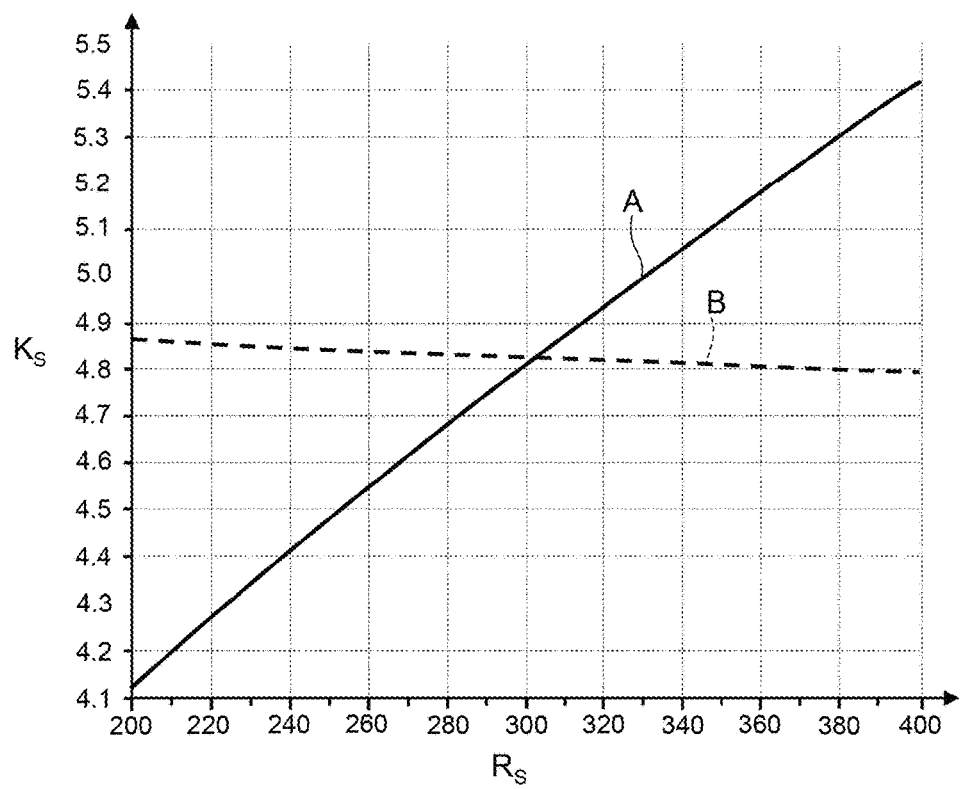
FIG. 5 shows the behaviour of characteristic quantities of the power MOS device of FIG. 2.

FIG. 5 shows the plot of the ratio between the surface areas of the MOS transistors 12, 13 (here defined as $K_S$) as a function of the variation of the resistance value $R_S$ of the detection resistor 14 for the known MOS device 1 in FIG. 1, indicated in FIG. 5 using reference sign A, and for the power MOS device 10 in FIG. 2, indicated using reference sign B, on the basis of simulations carried out by the applicant. In particular, the curves A and B are obtained by varying the resistance $R_S$ of the detection resistor 4 in FIG. 1 and of the detection resistor 14 in FIG. 2 with respect to a target value defined as the value at which, when the current $I_2$ flows in the detection resistor 4 and in the detection resistor 14, these resistors have a voltage drop $V_{KS}$ the value of which is correlated to the sensitivity of the detection circuit (not shown). The voltage drop $V_{KS}$ is compared to a constant threshold value by the detection circuit to generate an intervention signal. In general, the parameter $K_S$ has a near-constant value.

In particular, the curve A (for the known device 1 in FIG. 1) shows that, by varying the resistance $R_S$ of the detection resistor 4 by ±33% with respect to the target value, a variation in the parameter $K_S$ of ±25% is obtained. Consequently, varying the resistance value $R_S$ of the detection resistor 4, and therefore the voltage drop $V_{KS}$ on same, the parameter $K_S$, and therefore the ratio between the surface areas of the MOS transistors 2, 3, varies considerably and undesirably.

Conversely, the curve B (for the power device 10 in FIG. 2), for the same range of the resistance value of the detection resistor 14, shows a variation in the parameter $K_S$ of 1.3% in the resistance range shown, and therefore a low variability, as desired.

In practice therefore, the designer has greater freedom to select the resistance value $R_S$ of the detection resistor 14, regardless of the desired surface-area ratio for the MOS transistors 12, 13.

Figure 6:
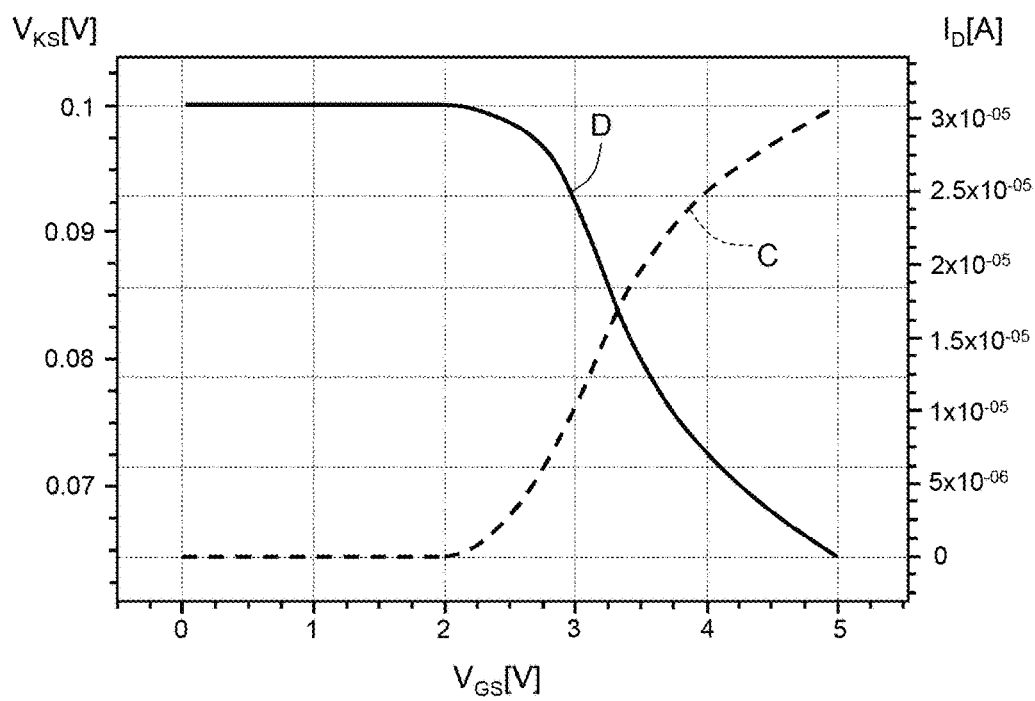
FIG. 6 shows the behaviour of electrical quantities of the power MOS device of FIG. 2, FIGS. 7-15 are cross sections of a silicon die in successive manufacturing steps of the power MOS device of FIG. 3.

FIG. 6 shows the behavior of some electrical quantities as a function of the gate/source voltage $V_{GS}$ of the MOS transistors 12, 13, by biasing the power MOS transistor 12 so as to have a drain/source voltage ($V_{DS}$) of 0.1 V, with a gate/source voltage ($V_{GS}$) variable between 0 and 5 V. In particular, the curve C shows the plot of the drain current $I_D$, and the curve D shows the plot of the voltage $V_{KS}$ detected on the detection node 18. The curves C and D have been measured by the applicant.

More specifically, after the power MOS transistor 12 has been turned on, $V_{GS} \approx 2$ V, the drain current $I_D$ increases and the voltage on the detection node 18 drops correspondingly, confirming the correct detection of the current in the power MOS transistor 12.

FIGS. 7-15 show manufacturing steps of the power MOS device 10 shown in FIGS. 3 and 4, only for the active area of the device, and therefore omitting the edge areas and the external pads.

Figure 7:
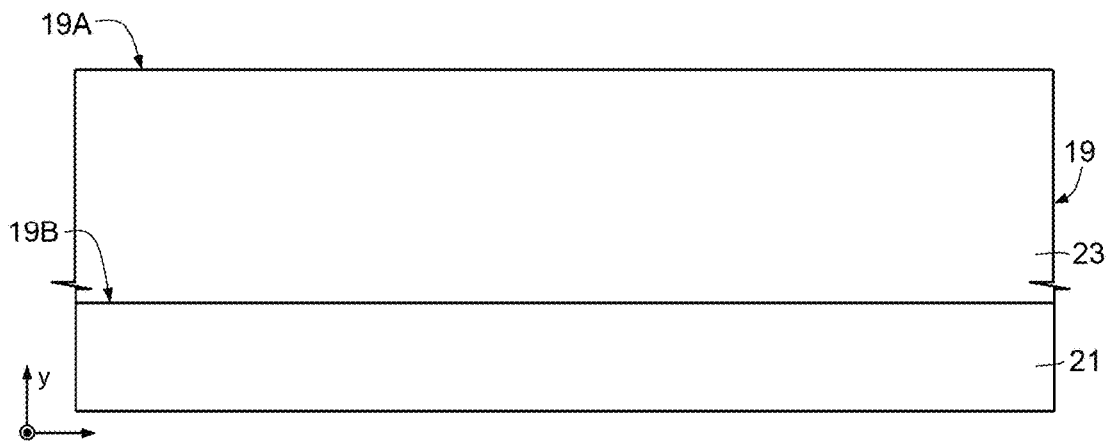

With reference to FIG. 7, the epitaxial layer 23 is initially grown on the substrate 21, thereby forming the semiconductor body 19. The thickness and the doping concentration of the epitaxial layer 23 is such as to guarantee the desired output impedance and breakdown performance in the power MOS transistor 12, in a manner known to the person skilled in the art.

Figure 8:
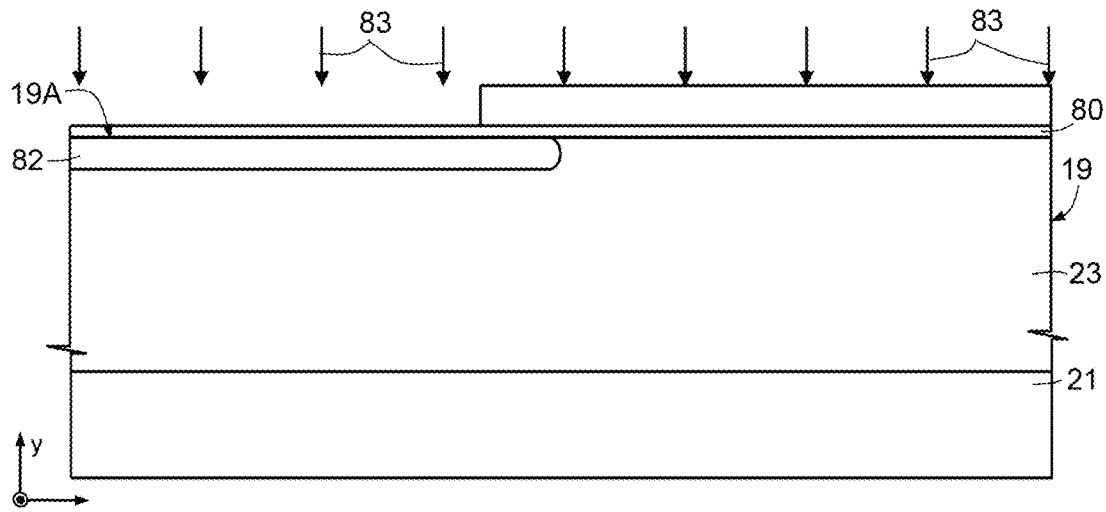

Subsequently and as shown in FIG. 8, a first protective layer 80, for example made of silicon oxide (SiO$_2$) is deposited or grown thermally on the first surface 19A. Subsequently, known photolithography and ion implantation and techniques, shown schematically by arrows 83, are to form an N-type implanted region 82 intended to form the drift region 22.

Figure 9:
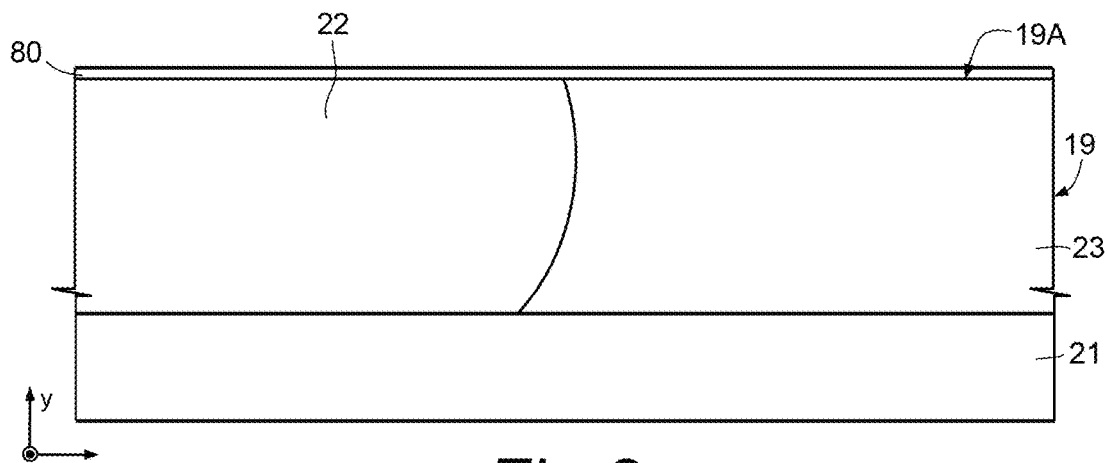

Subsequently and as shown in FIG. 9, a heat treatment is performed to diffuse the ions of the implanted region 82, thereby obtaining the drift region 22.

Figure 10:
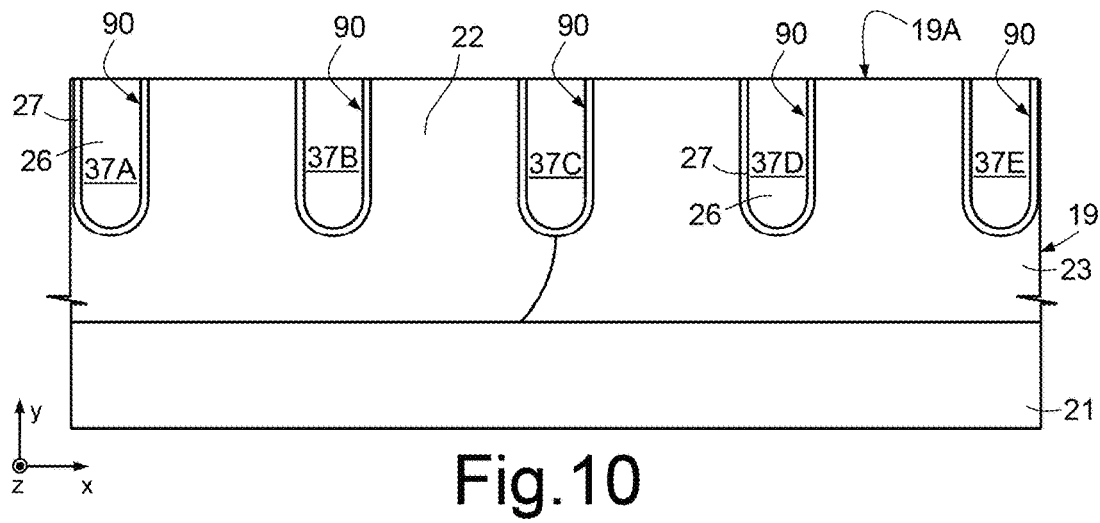

Subsequently and as shown in FIG. 10, the first protective layer 80 is removed and a plurality of gate trenches 90 is formed from the first surface 19A using known masked wet/dry etching techniques. The gate trenches 90 are then filled by thermally growing an insulating gate layer and depositing a filling layer, for example using polysilicon of the first conductivity type that is doped in situ. The portions of the insulating gate layer and of the filling layer on top of the first surface 19A are removed, for example using aniso- tropic dry etching, such as to form the trench gate regions 26 and the insulating gate layer 27. This creates the insulated gate regions 37A-37E delimiting the coupling portions 40, the active portions 41, the inactive portions 42 and the detection portions 43.

Figure 11:
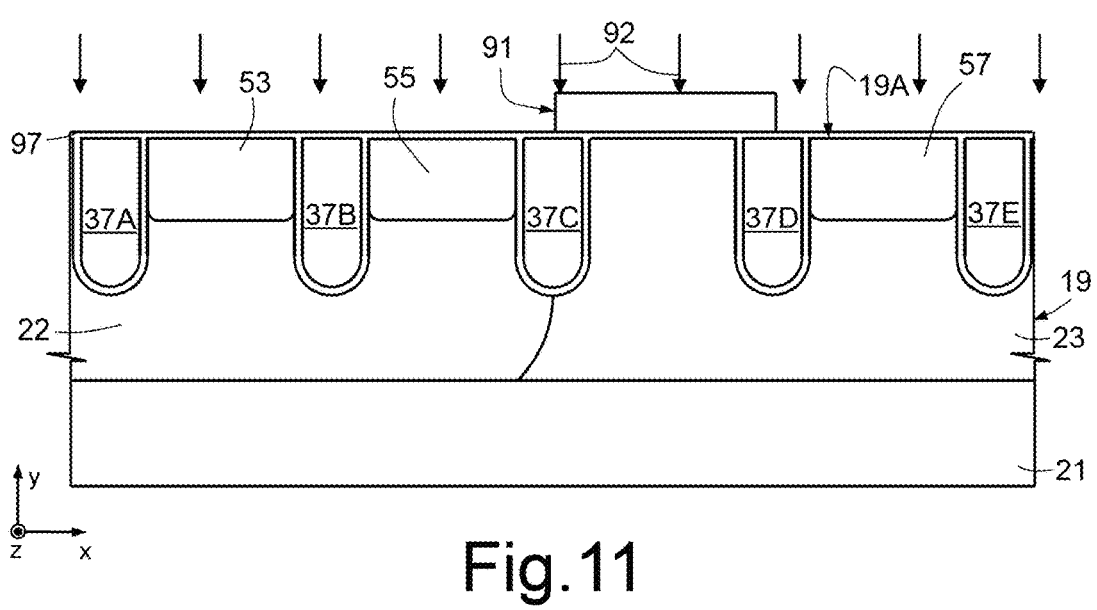

Subsequently and as shown in FIG. 11, a second protective layer 97 made of insulating material is deposited on the first surface 19A and a first photoresist mask 91 is formed using known photolithography techniques. An ionic implantation process, indicated in FIG. 11 using a plurality of arrows 92, is used to implant P-type ionic dopant species, such as boron, thus forming the channel regions 53, 55, 57. The first photoresist mask 91 is then removed.

Figure 12:
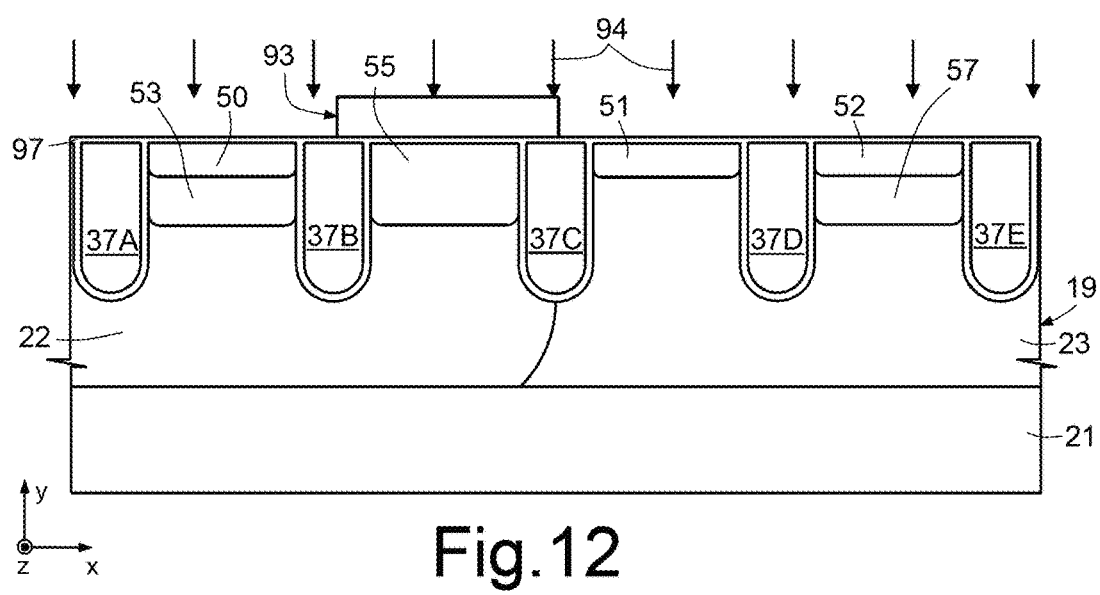

As shown in FIG. 12, a second photoresist mask 93 is then used to perform a subsequent implantation of N-type ionic dopant species, such as arsenic, to form the source regions 50, 52 and the enrichment region 51, as shown by the arrow 94. The second photoresist mask 93 is then removed.

Figure 13:
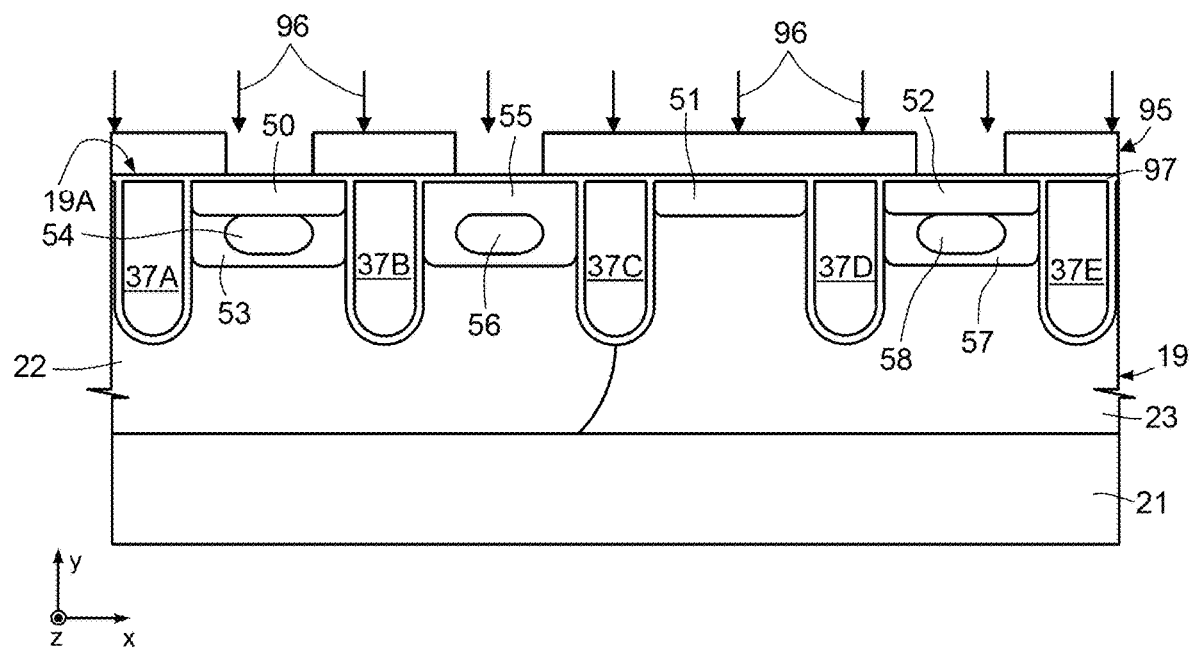

A third photoresist mask 95, as shown in FIG. 13, is then used to perform a high-energy implantation of P-type ionic dopant species, such as boron, as shown by the arrows 96. The implantation parameters are in particular selected to form the enriched regions 54, 56, 58 at a distance of approximately 600 nm from the first surface 19A, in a known manner. More specifically, the enriched regions 54, 58 are formed beneath the source regions 50, 52. The third photoresist mask 95 is then removed.

Figure 14:
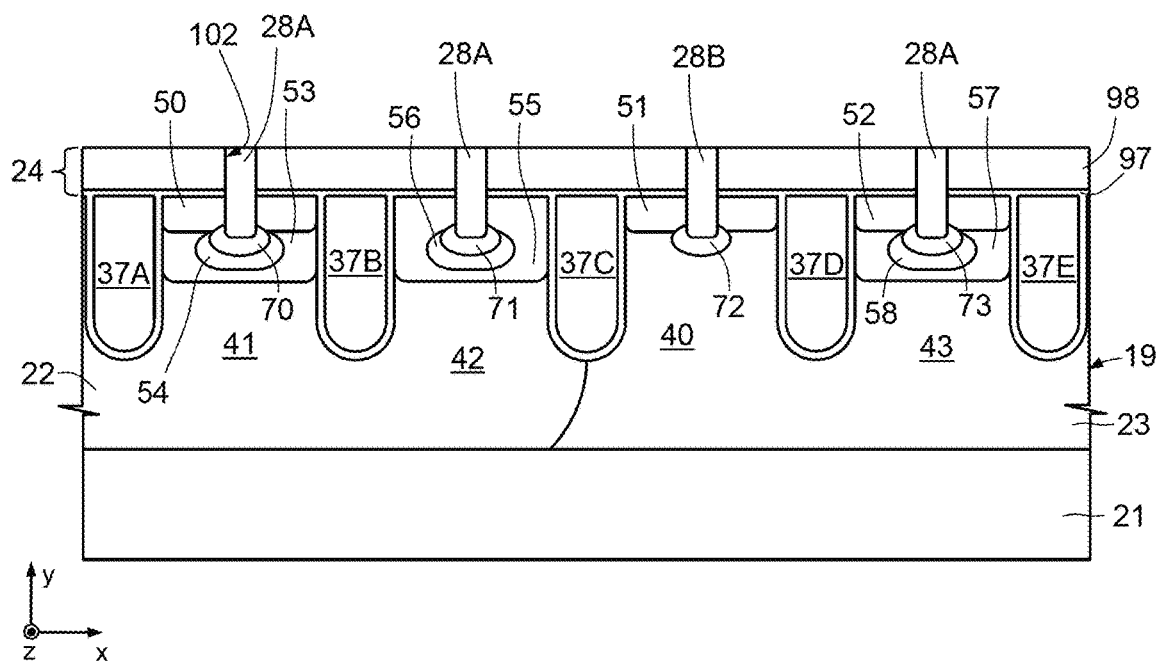

Subsequently and as shown in FIG. 14, a dielectric layer 98, for example made of silicon oxide, is deposited to form the insulating layer 24 in FIG. 3 along with the second protective layer 97. Contact trenches 102 are then formed in the regions designed to contain the contact regions 28A and 28B. The second enriched regions 70-73 are then implanted. The contact trenches 102 are then filled with metal material (such as titanium and/or tungsten), thereby forming the plurality of contact regions 28A, 28B.

Figure 15:
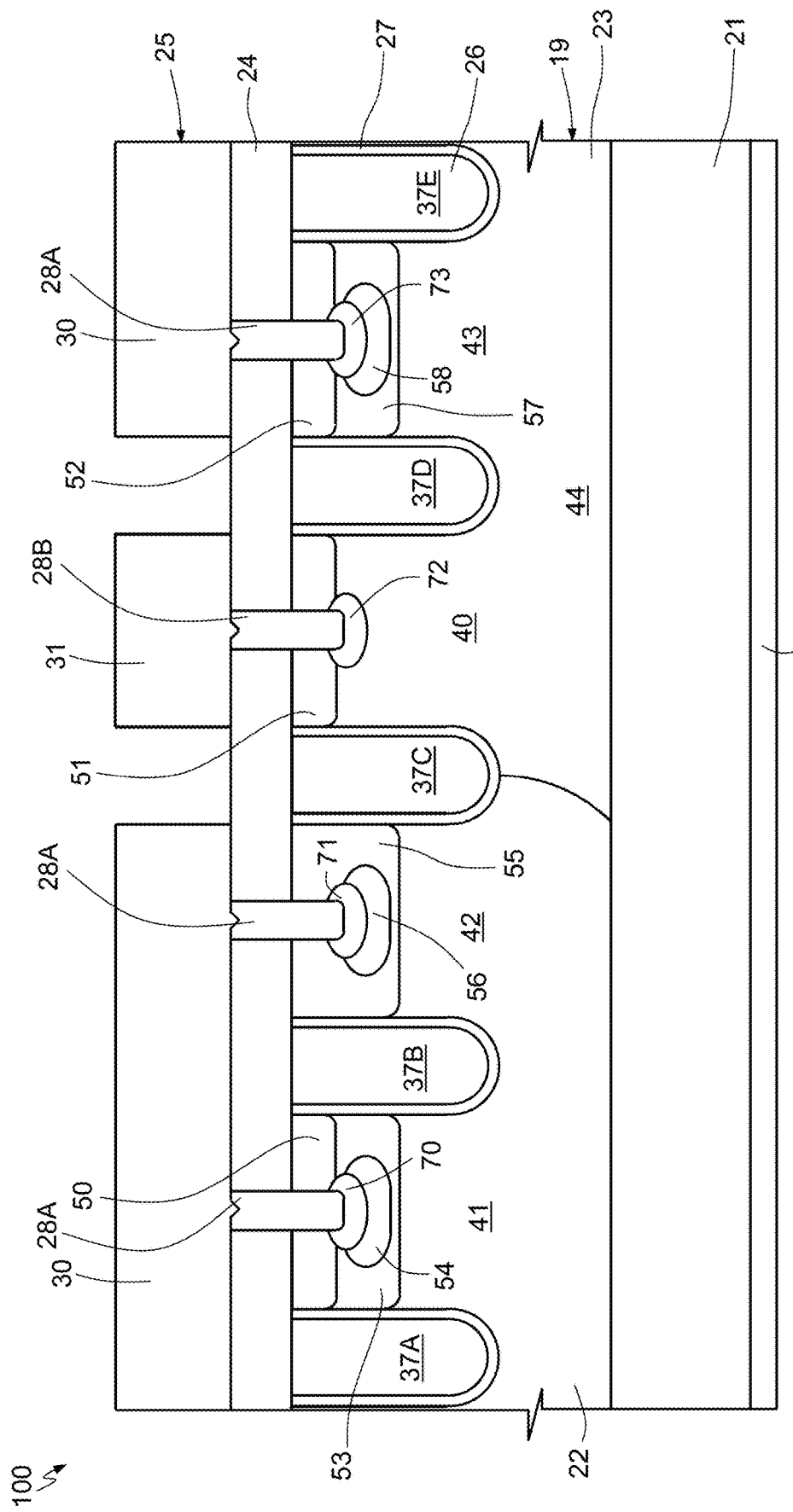

Finally and as shown in FIG. 15, the source metallization layer 25 is deposited on the upper surface of the insulating layer 24. The source metallization region 30 and the detection metallization region 31 are defined using known selective photolithography and etching techniques. Furthermore, the drain metallization layer 20 is deposited on the second surface 19B, thus forming the MOS device 10 in FIG. 3.

Figure 16:
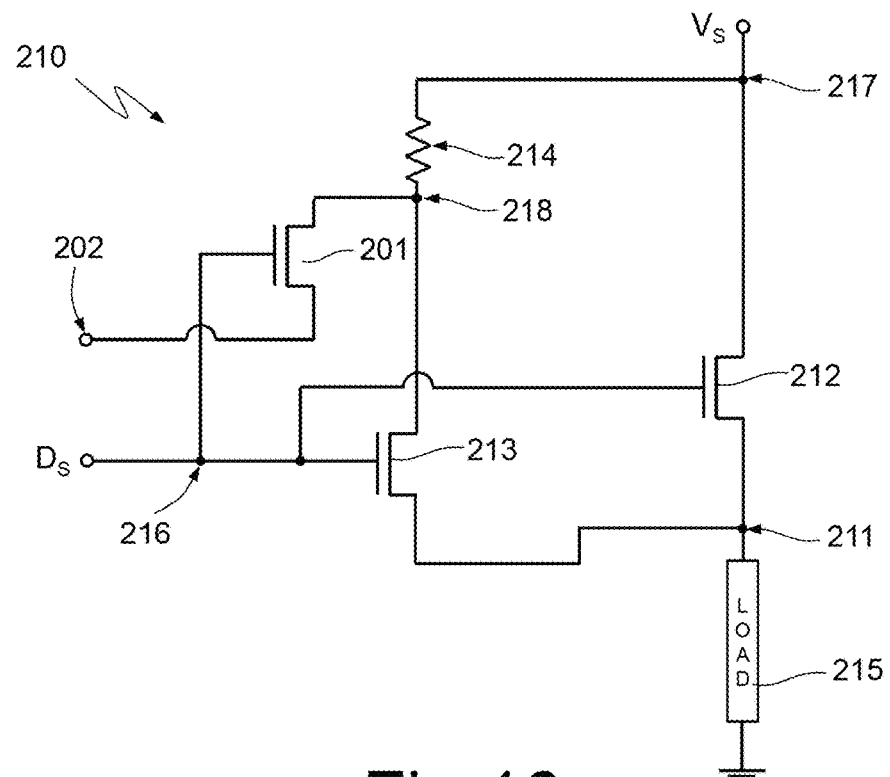
FIG. 16 is an electric diagram of another embodiment of the present power MOS device.
Figure 17:
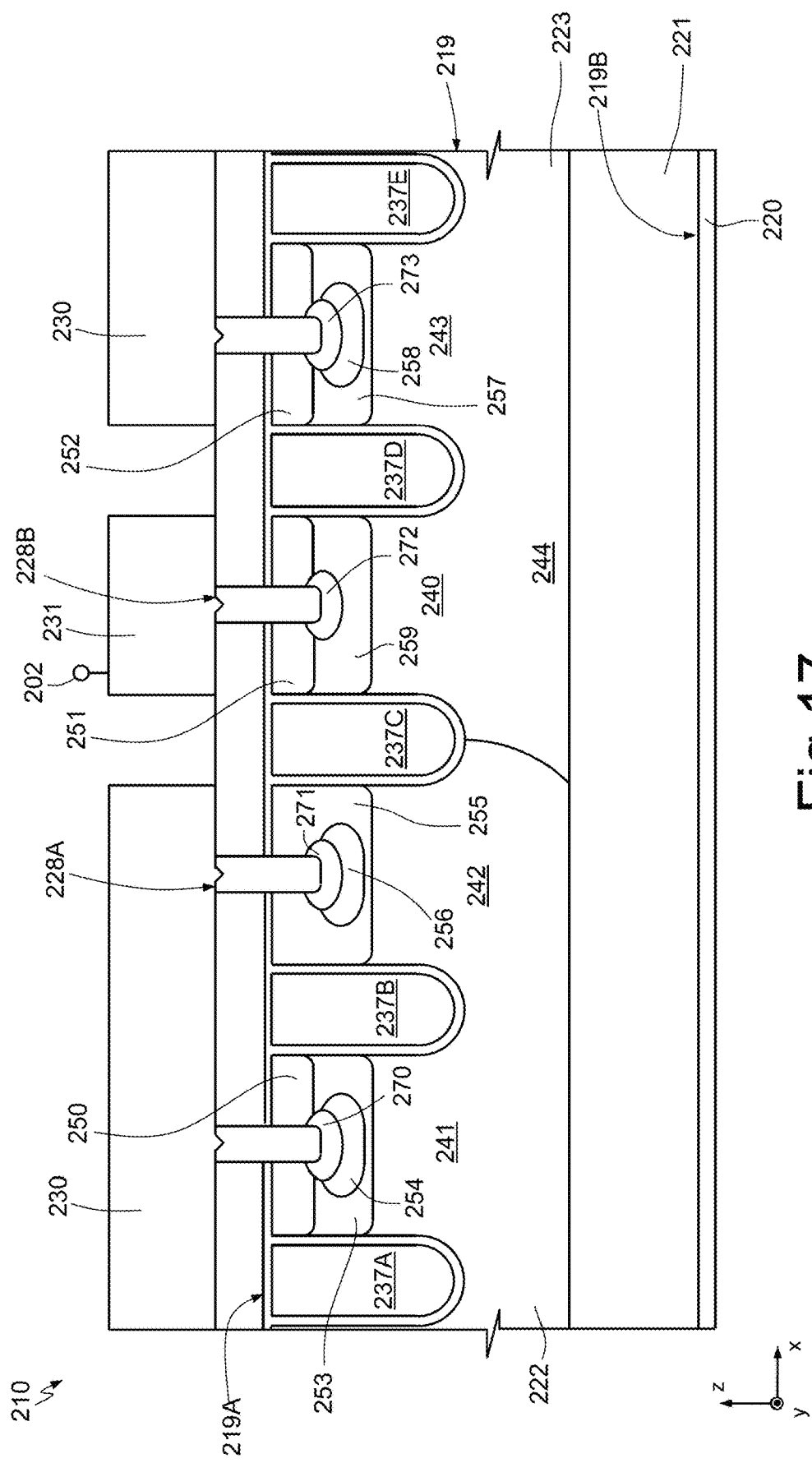
FIG. 17 is a cross section of the power MOS device of FIG. 16.

FIGS. 16-17 show a variant of the power MOS device 10. More specifically, FIGS. 16 and 17 show a power MOS device 210 including a connection MOS transistor 201. The general structure of the power MOS device 210 is similar to the structure of the power MOS device 10 in FIG. 2, and therefore the parts similar to those shown and described with reference to FIG. 2 are indicated in FIGS. 16 and 17 using reference signs increased by 200, and are not further described.

The connection MOS transistor 201 is coupled to the detection node 218 and is controlled using the drive signal Ds. More specifically, the connection MOS transistor 201 has a gate terminal coupled to the drive node 216, a drain terminal coupled to the detection resistor 214 via the detection node 218 and a source terminal coupled to the external circuitry (not shown) at a detection terminal 202.

In use, the power MOS device 210 behaves in a manner similar to the manner described for the power MOS device 10 in FIG. 2.

More specifically, the connection MOS transistor 201 enables the detection resistor 214 to be connected to and disconnected from the external circuitry connected to the detection node 218. In fact, when the power supply voltage Vs is low, the connection MOS transistor 201 is turned off and disconnects the detection resistor 214 from the external circuitry.

The power MOS device 210 in FIG. 16 may be implemented as shown in FIG. 17.

As visible, the power MOS device 210 has a structure similar to the power MOS device 10 shown in FIG. 2, except for the fact that the coupling portion 240 accommodates a P-type connection channel region 259, which in turn accommodates a connection source region 251. The connection channel region 259 is similar to the channel regions 254-257 (and to the channel regions 54-57 in FIG. 3) and may be made at the same time as same, modifying the mask 91 in FIG. 11. The connection source region 251 is similar to the enrichment region 51 (FIG. 3) and is made in a similar manner (FIG. 12).

Figure 18:
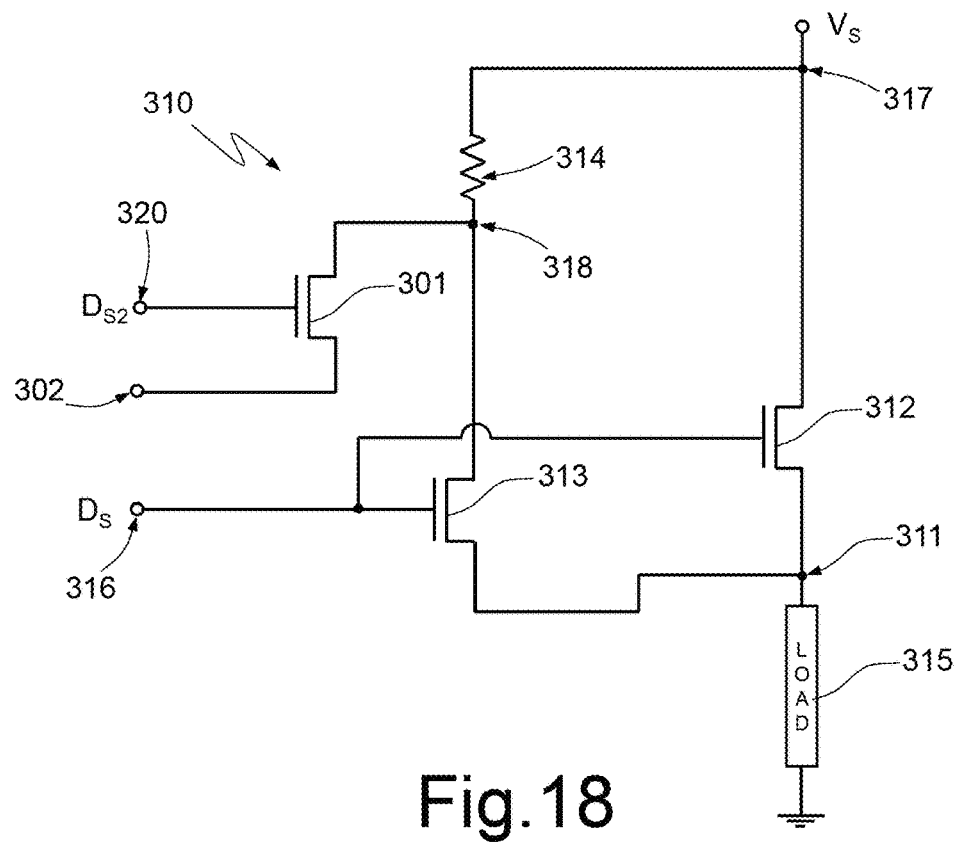
FIG. 18 is a electric diagram of an alternative embodiment of the present power MOS device.

FIG. 18 shows a variant of the power MOS device, indicated in this case using reference sign 310, including the connection MOS transistor 301. The structure of the power MOS device 310 is overall similar to the structure of the power MOS device 210 in FIG. 16 and only differs in that the gate terminal of the connection MOS transistor 301 is connected to a dedicated connection terminal 320 receiving a secondary drive signal $D_{S2}$. In all other aspects, the power MOS device 310 is the same as the device in FIG. 16, and therefore similar parts are indicated in FIG. 18 using reference signs increased by 100, and are not further described.

In use, the connection MOS transistor 301 has the same function as the connection MOS transistor 201 in FIG. 16, but can be controlled via the drive signal $D_{S2}$, regardless of the voltages present in the power MOS device 310. Accordingly, connection of the detection node 318 to the external circuitry for monitoring the current supplied to the load 315 by the power MOS device 310 can be controlled, giving the user greater freedom when monitoring said current.

The power device described herein provides numerous advantages. Indeed, by virtue of the positioning of the detection resistor 14; 214; 314 it is possible to prevent a systematic error and therefore any electrical misalignment between the power MOS transistor 12; 212; 312 and the detection MOS transistor 13; 213; 313, enabling them to operate under the same biasing conditions. Furthermore, the inactive portion 42; 242 between the coupling portion 40; 240 and the active portion 41; 241 provides a low-resistance current path and prevents the current to be measured from flowing towards the active portion 41; 241 instead of through the coupling portion 40; 240, and therefore towards the detection node 18; 218. This is also true of the circuit in FIG. 18, which is also implemented in the manner shown in FIG. 17.

It is evident that modifications and variations may be made to the device and method described and illustrated without thereby departing from the scope of the present disclosure. For example, the conductivity types may be inverted.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:

forming, in a semiconductor body having a first surface and a second surface, a power MOS transistor having a first conduction region, a gate region and a second conduction region, the first conduction region of the power MOS transistor being electrically coupled to a reference-potential node, the second conduction region of the power MOS transistor being electrically coupled to a load node and the gate region of the power MOS transistor being electrically coupled to a drive node, forming in the semiconductor body a detection MOS transistor having a first conduction region, a gate region and a second conduction region, the first conduction region of the detection MOS transistor being electrically coupled to a detection node, the second conduction region of the detection MOS transistor being electrically coupled to the load node and the gate region of the detection MOS transistor being directly electrically and physically connected to the drive node, forming in the semiconductor body a detection resistor having a first terminal electrically coupled to the reference-potential node and a second terminal electrically coupled to the detection node, forming a first metallization region on the first surface and in electrical contact with the second conduction region of the power MOS transistor and the second conduction region of the detection MOS transistor, forming a detection metallization region on the first surface and electrically coupled to the detection node, and forming a second metallization region on the second surface and in electrical contact with the first conduction region of the power MOS transistor and electrically coupled to the reference-potential node.

2. The method of claim 1, wherein the semiconductor body has a first conductivity type and forming the power MOS transistor and the detection MOS transistor include:

forming a plurality of insulated gate regions inside the semiconductor body from the first surface, the plurality of insulated gate regions including a first insulated gate region, a second insulated gate region, a third insulated gate region, a fourth insulated gate region and a fifth insulated gate region, a portion of the semiconductor body between the third insulated gate region and the fifth insulated gate region forming a coupling portion, introducing ionic dopant species of a second conductivity type into a first portion of the semiconductor body arranged between the first insulated gate region and the second insulated gate region and into a second portion of the body arranged between the third insulated gate region and the fourth insulated gate region to form a first channel region and a second channel region, introducing ionic dopant species of the first conductivity type into the first channel region and the second channel region to form the second conduction region of the power MOS transistor and the second conduction region of the detection MOS transistor, and forming contact regions inside the first portion, the second portion and the coupling portion, the contact regions extending from the first surface towards the second surface.

3. The method of claim 2, further including introducing ionic dopant species of the first conductivity type into the coupling portion, forming an enrichment region adjacent to the first surface.

4. The method of claim 3, further including introducing ionic dopant species of the second conductivity type into the coupling portion, forming a connection channel region being arranged inside the semiconductor body beneath the enrichment region.

5. The method of claim 2, further including, before formation of the plurality of insulated gate regions, diffusing ionic dopant species of the first conductivity type into the semiconductor body, in a zone designed to contain the first insulated gate region and the second insulated gate region, forming a drift region extending between the first surface and the second surface and designed to be laterally delimited in part by the fifth gate region.

6. The method of claim 1, further including forming a metallization layer above the first surface and shaping the metallization layer to form the detection metallization region and the first metallization region.

7. The method of claim 1, wherein the first conduction region of the power MOS transistor is physically connected to the reference-potential node, the second conduction region of the power MOS transistor is physically connected to the load node, and the gate region of the power MOS transistor is physically connected to the drive node.

8. The method of claim 1, wherein the first conduction region of the detection MOS transistor is physically connected to the detection node, the gate region of the detection MOS transistor is physically connected to the drive node, and the second conduction region of the detection MOS transistor is physically connected to the load node.

9. The method of claim 8, wherein the first terminal of the detection resistor is physically connected to the reference-potential node, and the second terminal of the detection resistor is physically connected to the detection node.

10. The method of claim 1, further comprising:
forming a switch electrically coupled to the second terminal of the detection resistor, the switch configured to selectively electrically couple the detection resistor to the detection node.

11. A method of forming a power MOS device, comprising:
forming, in a semiconductor body having a first conductivity type, a first surface, and a second surface, a first region having the first conductivity type and a first doping level,
forming, in the semiconductor body, a drift region having the first conductivity type and a second doping level greater than the first doping level, the drift region arranged between the first surface and the second surface;
forming first, second, third, fourth, and fifth insulated gate regions in the semiconductor body, the first and second insulated gate regions arranged in the drift region and extending into the semiconductor body from the first surface, the third and fourth insulated gate regions arranged in the first region;
forming a first channel region having a second conductivity type, the first channel region arranged in the drift region and laterally between the first insulated gate region and the second insulated gate region, which are adjacent to one another;
forming a second channel region having the second conductivity type, the second channel region arranged inside the first region and between the third insulated gate region and the fourth insulated gate region, which are adjacent to one another;
forming a third channel region having the second conductivity type, the third channel region arranged inside the first region and between the third insulated gate region and the fifth insulated gate region, which are adjacent to one another;
forming an inactive pseudo-channel region having the second conductivity type, arranged inside the drift region and between the second insulated gate region and the fifth insulated gate region, which are adjacent to one another, the inactive pseudo-channel region being devoid of any source regions;
forming a first source region having the first conductivity type and being arranged between the first channel region and the first surface of the semiconductor body, the first source region abutting the first and the second insulated gate regions and extending laterally from the first insulated gate region toward the second insulated gate region, the first source region, the first channel region, the first insulated gate region and the second insulated gate region being part of a power MOS transistor;
forming a second source region having the first conductivity type and being arranged between the second channel region and the first surface of the semiconductor body, the second source region, the second channel region, the third insulated gate region and the fourth insulated gate region being part of a detection MOS transistor;
forming a third source region having the first conductivity type and being arranged between the third channel region and the first surface of the semiconductor body, the third source region, the third channel region, the third insulated gate region, and the fifth insulated gate region being part of a connection MOS transistor;
forming a first contact region extending from the first surface into the third channel region; and
forming a resistive detection portion of the semiconductor body arranged beneath the second and third channel regions and forming a detection resistor.

12. The method of claim 11, wherein the drift region is delimited laterally in part by the fifth insulated gate region.

13. The method of claim 11, further including:
forming a second contact region and a third contact region extending from the first surface into the body, the second contact region passing through the first source region and the first channel region, the third contact region passing through the second source region and the second channel region;
forming a source metallization region extending above the first surface in electrical contact with the second contact region and the third contact region; and
forming a detection metallization region in electrical contact with the first contact region, the source metallization region, and the detection metallization region being formed on a same metallization level.

14. The method of claim 11, wherein the connection MOS transistor is a switch electrically coupled to the detection resistor and configured to selectively electrically couple the detection resistor to a detection terminal.

15. The method of claim 11, wherein the connection MOS transistor includes a connection channel region having a second conductivity type, the connection channel region being arranged inside the first region of the semiconductor body.

16. The method of claim 15, wherein the third and fourth insulated gate regions are configured to receive a drive signal.

17. A method, comprising:
forming a power MOS transistor in a drift region of semiconductor body having a first surface and a second surface, the power MOS transistor having a first conduction region, a gate region and a second conduction region, the first conduction region of the power MOS transistor being directly electrically and physically connected to a reference-potential node, the second conduction region of the power MOS transistor being directly electrically and physically connected to a load node and the gate region of the power MOS transistor being directly electrically and physically connected to a drive node, wherein forming the power MOS transistor includes:
  forming first and second insulated gate regions arranged inside the drift region and extending into the semiconductor body from the first surface;
  forming a first channel region having a second conductivity type, arranged in the drift region laterally between the first insulated gate region and the second insulated gate region; and
  forming a first source region having the first conductivity type and being arranged between the first channel region and the first surface of the semiconductor body, the first source region abutting the first and the second insulated gate regions and extending laterally from the first insulated gate region toward the second insulated gate region, the second conduction region of the power MOS transistor including the first source region;
forming a detection MOS transistor in a first region of the semiconductor body, the first detection MOS transistor including a first conduction region, a gate region and a second conduction region, the first conduction region of the detection MOS transistor being directly electrically and physically connected to a detection node, the second conduction region of the detection MOS transistor being directly electrically and physically connected to the load node and the gate region of the detection MOS transistor being directly electrically and physically connected to the drive node, the first region having a first conductivity type and a first doping level, the drift region having the first conductivity type and a second doping level greater than the first doping level, the drift region being arranged between the first surface and the second surface;
forming a connection MOS transistor in the first region of the semiconductor body, the connection MOS transistor including a first conduction region, a gate region and a second conduction region, the first conduction region of the connection MOS transistor being directly electrically and physically connected to the detection node;
forming a detection resistor in the first region semiconductor body and extending between the reference-potential node and the detection node;
forming a first metallization region on the first surface and in electrical contact with the second conduction region of the power MOS transistor and the second conduction region of the detection MOS transistor;
forming a detection metallization region on the first surface and in electrical contact with the second conduction region of the connection MOS transistor; and
forming a second metallization region on the second surface and in electrical contact with the first conduction region of the power MOS transistor and electrically coupled to the reference-potential node.

18. The method of claim 17, wherein:
the semiconductor body has the first conductivity type;
the first insulated gate region and the second insulated gate region are positioned on opposite sides of the second conduction region of the power MOS transistor;
the gate region of the detection MOS transistor includes a third insulated gate region and a fourth insulated gate region positioned on opposite sides of the second conduction region of the detection MOS transistor; and
the gate region of the connection MOS transistor includes the third insulated gate region and a fifth insulated gate region positioned on opposite sides of the second conduction region of the detection MOS transistor.

19. The method of claim 17, wherein forming the connection MOS transistor includes forming a switch electrically coupled to the detection resistor and configured to selectively electrically couple the detection resistor to a detection terminal.

20. The method of claim 17, further comprising electrically coupling the gate region of the connection MOS transistor to the drive node.

* * * * *